United States Statutory Invention Registration [19]

[11] Reg. Number: H585

Cavallo [43] Published: Feb. 7, 1989

[54] ANISOTROPIC MAGNETORESISTANCE MEASUREMENT APPARATUS AND METHOD THEREOF

[75] Inventor: John M. Cavallo, Beltsville, Md.

[73] Assignee: The United States of America as represented by the Secretary of the Navy, Washington, D.C.

[21] Appl. No.: 146,012

[22] Filed: Jan. 20, 1988

[51] Int. Cl.[4] ..... G01R 33/02

[52] U.S. Cl. ..... 324/249; 324/244

*Primary Examiner*—Stephen C. Buczinski
*Assistant Examiner*—Linda J. Wallace
*Attorney, Agent, or Firm*—Kenneth E. Walden; Frederick A. Wein

[57] ABSTRACT

The present invention is an apparatus and method for the non-destructive testing of the anisotropic magnetoresistance parameters of a film. A plurality of contacts points are securely disposed in a generally planar support means and engagable with a surface of the film for measuring the anisotropic magnetoresistance parameters of the film in accord with a predetermined equation.

2 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

I+, I− CURRENT CONTACT POINTS
V+, V− SHEET RESISTANCE CONTACT POINTS
Vρ+, Vρ− MAGNETORESISTANCE CONTACT POINTS

V + BATTERY'S POSITIVE TERMINAL
GND BATTERY GROUND
V- BATTERY'S NEGATIVE TERMINAL
I+, I- CURRENT SENSE OUTPUT
$\rho$+, $\rho$ - SHEET RESISTANCE OUTPUT
$\Delta\rho$+, $\Delta\rho$ - MAGNETORESISTANCE OUTPUT

ANISOTROPIC MAGNETORESISTANCE MEASUREMENT APPARATUS AND METHOD THEREOF

BACKGROUND OF THE INVENTION

The present invention relates to measurement probes, and more particularly, to probes for measurement of anisotropic magnetoresistance characteristics of thin films and the like.

The anisotropic magnetoresistance of a thin metal film is a sensitive measure of the quality of the film. When the films are to be used in the development of devices that use the magnetoresistance, it becomes necessary to measure that quantity on every film. The measurement must therefore be made easily and without damaging the film in the process.

Heretofore, the techniques commonly used to measure the sheet resistance of a thin metal film either cannot measure the magnetoresistance or destroy the film in the process of measuring it. One technique is etching or cutting the film into a strip and making two or four wire resistance measurements on the strip. This technique can measure the magnetoresistance, but it leaves the film in an unsuitable condition for further processing. The second technique is to make contact with the film at four collinear points, using a device called a four-point probe, and make voltage versus current measurements. This method is nondestructive but is not sensitive to the anisotropic magnetoresistance. The third technique is to process the film to produce a small magnetoresistive device on a small portion of the film and then test this device. This approach requires considerable processing to be accomplished on the tested thin film which might be discarded for failing the test.

Additionally, the results measured on a small portion of the film using this produced device may not be representative of the rest of the area of the thin film under test.

Accordingly, it is desirable to provide a device and method for measurement of magnetoresistance parameters of thin films which overcomes the deficiencies of the prior devices and methods discussed hereinabove.

Accordingly, it is an object of the present invention to provide a device and method thereof for measurement of magnetostrictive parameters in thin films at an early stage of production in a non-destructive manner. Further objects and advantages of the present invention will become apparent as the following description proceeds and features of novelty characterizing the invention will be pointed out with particularity in the claims annexed to and forming a part of this specification.

SUMMARY OF THE INVENTION

Briefly, the present invention is an apparatus and method for the non-destructive testing of the magnetoresistance parameters of a film. A plurality of contact points are securely disposed in a generally planar support means and are engageable with a surface of the generally planar film for measuring the magnetoresistance parameters of the film in accord with a predetermined equation.

DESCRIPTION OF THE DRAWINGS

For a better understanding of the present invention reference may be had the accompanying drawings wherein.

DETAILED DESCRIPTION OF THE PREFERRED EMBODIMENT

A resistance probe is non-destructive and basically consists, inter alia, of four needles that make contact with the film under test at four points that are equally spaced along a line. In the most commonly used mode of operation, a current is passed between the outer two points, and the voltage between the inner two points is measured. The ratio of the voltage to the current is proportional to the sheet resistance. In alternative mode of operation, the outer two needles are used for the voltage contacts and the inner two for the current contacts. It will be shown later that the relationship between the voltage/current ratio and the sheet resistance is the same in both modes of operation.

Figure 1:
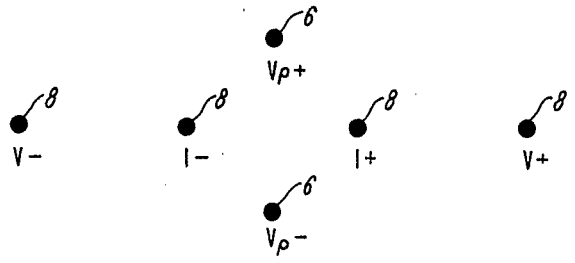
FIG. 1 is a diagrammatic representation of the relative positions of the probe contact points of the present invention.

Since contacts that are collinear with the current contacts are insensitive to the anisotropic magnetoresistance, two contacts are added to the in-line probe to make it sensitive to the anisotropic magnetoresistance. With reference to FIG. 1, the additional contacts 6 are placed in such a way with relation to in-line contacts 50 so as to eliminate the signal due to the isotropic resistance, and maximize the signal due to the anisotropic magnetoresistance. The optimum position of the probe points are determined by analyzing the current distribution and the electric potential within the film as presented herein. The first step of such an analysis is the case of isotropic resistance, and then extended to the case of an anisotropic magnetoresistance.

The positions of the added contacts are chosen on the basis of the following two criteria. First, the contacts should be placed at points that maximize the magnetoresistancce signal to aid in the measurement. An added benefit in this placement would be the minimization of errors due to the misplacement of the contacts. Second, the contacts should be placed in such a way that they are insensitive to the isotropic resistance. This reduces the difficulties due to noisy contacts, drifts in the isotropic resistance, and allows the measurements to be made at d-c with simple equipment.

In a thin film, when the current is injected at a point, the current will spread out in all directions. The current density therefore will decrease with the distance from the current contacts because the current must be spread over the circumference of ever larger circles. Since, by Ohm's law, the electric field is proportional to the current density, the field is also decreasing. Hence the current density throughout the film can be calculated from Ohm's law and the conservation of current.

The magnetoresistance signal is determined by the second and third terms of equation 11 (shown hereinafter). Each term as a maximum of of $\ln(1+\Delta\rho/\rho_o)$ and a minimum of 0. The magnetoresistance signal would therefore be maximized if the subtrahend were $\ln(1+\Delta\rho/\rho_o)$ and the minuend were 0. This occurs at the coordinates $$x = d\cos 2\theta$$

$$y = d\sin 2\theta \tag{1}$$

The magnetoresistance signal is minimized when the subtrahend is 0 and the minuend is $\ln(1+\rho/\rho_o)$, which occurs at the coordinates $$x = -d\cos 2\theta$$

$$y = -d\sin 2\theta \tag{2}$$

The signal is the voltage difference between two probe points so if one contact is placed at the position of maximum signal and the other at the point of minimum signal, the output voltage due to the magnetoresistance would be maximized.

The first term in equation 11 is due to the isotropic resistance. Substituting the positions of the probe points given in equations 1 and 2 into that term, it can be shown that the signal due to the isotropic resistance is proportional to the logarithm of the cotangent of theta, which is zero when $\theta = 45°$. The position of the added contacts, equations 1 and 2, would therefore be (O,d) and (O,−d), shown in FIG. 1.

If the magnetization were not at the optimum angle of 45°, the voltage between the added points, from inserting the location of the points into equation would be:

$$V = \frac{IR}{2\pi}\left[\mathrm{Ln}\left(1 + \frac{\Delta\rho}{\rho_0}(\cos\theta + \sin\theta)^2\right) - \mathrm{Ln}\left(1 + \frac{\Delta\rho}{\rho_0}(\cos\theta - \sin\theta)^2\theta\right)\right] \tag{3}$$

Since the magnetoresistance is a small fraction of the isotropic resistance, the voltage between the points can be approximated by:

$$V = \frac{IR}{2\pi}\,\frac{\Delta\rho}{\rho_0}\sin 2\theta \tag{4}$$

This technique measures the anisotropy in the resistance due to all causes. The magnetoresistance can be distinguished from the anisotropy due to other causes by making a first measurement with the magnetization at 45° to the probe's axis, and a second measurement at −45°. The magnetoresistance would have the same magnitude but opposite signs. The difference between the two measurements would be twice the signal due to the magnetoresistance, $$V = \frac{IR}{\pi}\,\frac{\Delta\rho}{\rho_0} \tag{5}$$

Contact points for measuring the isotropic resistance are also placed on the modified probe so that the isotropic resistance could be measured along with the magnetoresistance. These contacts are placed outside of the current contacts, as shown in FIG. 1, to allow the probe to be as small as possible. From equation 11 it is seen that the voltage, V between the contacts measuring the isotropic resistance is:

$$V_\rho = \frac{IR}{\pi}\,\mathrm{Ln}\,2 \tag{6}$$

The quotient of equations 5 and 6 gives a relationship between the ratio of the magnetoresistance and the isotropic resistance and the ratio of $\Delta V_{\Delta\rho}$ and $V_\rho$, $$\frac{\Delta\rho}{\rho_0} = \frac{\Delta V_{\Delta\rho}}{V_\rho}\,\mathrm{Ln}\,2 \tag{7}$$

From this it is seen that one of the salient features of an in-line probe is that the relationship of V/I to the resistivity is independent of the dimensions of the probe. It should also be realized that the current spreads throughout the entire film, so the probe measures the resistance over an extended area. The dimensions of the probe must therefore be small compared to the size of the film, and the probe should not be near the edge of the film.

The resistance in most materials is isotropic, and as a consequence, the current density is parallel to, as well as proportional to, the electric field. This is shown in the familiar form of Ohm's law:

$$E = \rho J \tag{8}$$

where $\rho$ is the resistivity of the material,

E is the electric field within the film, and

J is the current density.

The current is conserved except at the current contacts, so the divergence of the current density vanishes everywhere throughout the film except at the source and sink.

In a material that has an anisotropic resistance, the current density is not necessarily parallel to the electric field, but it is still proportional to the electric field. This is expressed in a less familiar form of Ohm's law, where the resistivity is a matrix rather than a scalar. In the case of magnetoresistance the resistivity matrix takes the form $$\rho = \begin{pmatrix} \rho_0 + \Delta\rho\cos^2\theta & \Delta\rho\sin\theta\cos\theta \\ \Delta\rho\sin\theta\cos\theta & \rho_0 + \Delta\rho\sin^2\theta \end{pmatrix} \tag{9}$$

where $\rho_o$ is the resistivity perpendicular to the magnetization, $\Delta\rho$ is the magnetoresistance, and $\theta$ is the angle of the magnetization to the x-axis.

The equation for the potential that results from this modification to Ohm's law is:

$$\nabla\rho^{-1} \equiv \phi = -I\,\delta(x-d)\,\delta(y) + I\delta(x+d)\delta(y) \tag{10}$$

where $\rho^{-1}$ is the inverse of the resistivity matrix, $\delta$ is the dirac delta function.

The solution to these equations can be reduced to the three terms $$\phi = \frac{IR}{4\pi}\,\mathrm{Ln}\,\frac{(x+d)^2 + y^2}{(x-d)^2 + y^2} + \tag{11}$$

-continued $$\frac{IR}{4\pi}\,\mathrm{Ln}\left(1+\frac{\Delta\rho}{\rho_0}\;\frac{((x+d)\cos\theta+y\sin\theta)^2}{(x+d)^2+y^2}\right)-$$

$$\frac{IR}{4\pi}\,\mathrm{Ln}\left(1+\frac{\Delta\rho}{\rho_0}\;\frac{((x-d)\cos\theta+y\sin\theta)^2}{(x-d)^2+y^2}\right)$$

The first term is independent of the direction of the magnetization, i.e., it is the isotropic part of the potential, the second and third terms vanish if there is no magnetoresistance.

When the potential in equation (11) is evaluated for any points on the x-axis the second and third terms vanish, indicating that the magnetoresistance has no effect on the potential at those points. Therefore the in-line probe is not able to measure the magnetoresistance. The only way to modify the probe so that the probe can measure magnetoresistance is to add contacts that are not collinear with the current contacts as stated above.

Figure 2:
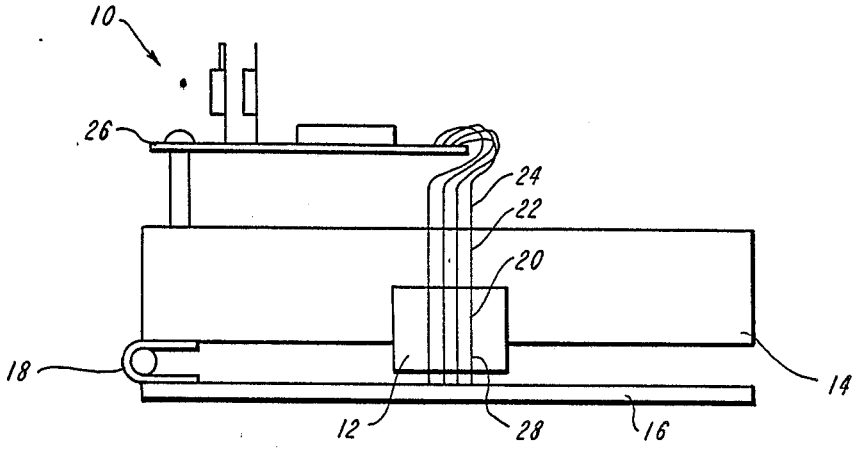
FIG. 2 is a diagrammatic representation of the construction of the probe of the present invention.
Figure 3:
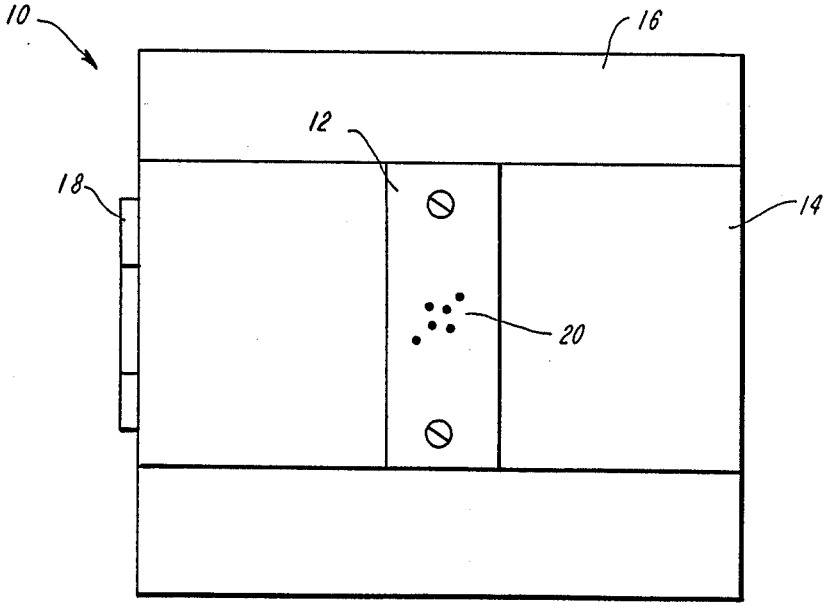
FIG. 3 is a bottom view of the probe of FIG. 2.

The construction of the probe generally designated 10 disclosed herein is shown in FIGS. 2 and 3 for measuring the magnetoresistance of thin permalloy films. The probe structure in the exemplary embodiment is made out of acrylic sheet. Contact support 12 is demountable so that probes can be replaced. Probe body 14 is attached to a base 16 by a hinge so that the points 20 will make a uniform contact with the film (not shown) to be tested and so that the probe 10 will have less of a chance of sliding across the film and scratching it.

The contact with the films can be made using contact points 20 manufactured by OB Test Group Inc., (Warwick, RI). Contacts points 20 consist of three parts: (1) a receptacle 22 that is permanently mounted in the probe body 14; (2) terminals 24 for attaching the wires that connect to electronics 26, and (3) terminals 24 for attaching the wires that connect to the film. The spear point is removable so that it can be replaced when it becomes dull.

Figure 4:
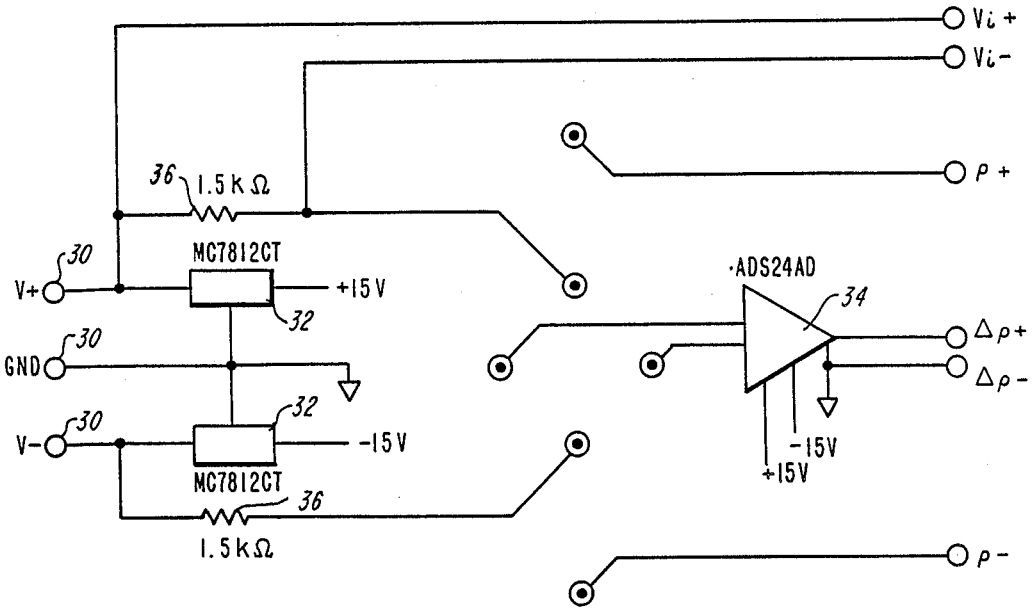
FIG. 4 is a block diagram representation of the electronics of the probe of the present invention.

FIG. 4 is a diagram of the electronics for probe 10 and provide the current for probe 10 amplify the output signal. A battery (not shown) is supplied providing +22.5 and −22.5 volts to power the system at terminals 30. Regulators 32 reduce the voltage to an acceptable range for the amplifier 34. Resistors 36 provide a current source for the resistivity measurements and the voltage drop Vi across one of them was a measure of the current through the film. The amplifier 34 provides a gain of 1000 and boosts the signal for the use of the probe for an oscilloscope.

The isotropic resistance is measured by the four collinear points of the probe. Expressing the current through the probe as the voltage, $V_I$, across the resistor R1, the isotropic resistance can be related to the ratio of $V_\rho$ and $V_I$ by $$\rho = 6799\Omega\,\frac{V_\rho}{V_I}$$

Figure 5:
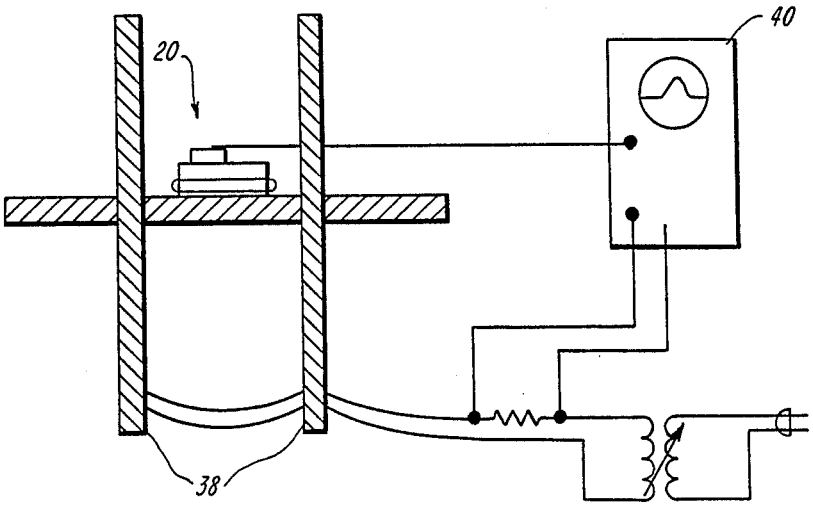
FIG. 5 shows a diagrammatic representation of a test setup using the probe of the present invention.

Referring now to FIG. 5, there is shown the probe 20 is placed inside of a Helmholtz coil 38 so that the field of the coil 38 could reorient magnetization. In this setup, probe should be oriented at 45° to the axis of the coils, and the easy axis should be perpendicular to the coil's axis. The signal from the magnetoresistance would therefore be at a maximum when the field due to the coils 38 is zero, and a minimum when the fields of the coils is greater than the anisotropy constant of the film.

The coils 38 are driven by a 60 cycle a-c current source. An oscilloscope 40 is used in an "X-Y" mode with the X-axis being proportional to the current through the coils and Y-axis being proportional to the output from the probe. The diagrams of the resistance vs. external field (R-H curves) are generated by a computer simulation of the output of the probe, and vertified through the operation of the probe.

Permalloy is a ferromagnetic alloy with a uniaxial magnetic anisotropy, i.e., in the absence of external magnetic fields, the magnetization would orient itself parallel to an axis, called the easy axis which is determined when the film is made. The magnetization can be pulled away from this axis by an external magnetic field, for example by placing the film in a Helmholtz coil. The magnetization will become parallel to the external file if the field is great enough. If, however, the field is not large enough, the orientation of the magnetization will lie somewhere between the direction of the easy axis and the coil's axis. When an external field is applied antiparallel to the easy axis, the magentization will maintain its direction unless the strength of the external field is greater that a critical value known as the coercivity. The magnetization will change its direction in a sudden jump when the external field exceeds the coercivity.

The magnetization has a unique orientation for a large external field, but there are two energetically stable orientations for a small external field. The critical field intensity at which one of the orientations becomes unstable depends on the angle between the external field and the easy axis. When the critical field is exceeded, and the magnetization is in the unstable orientation, the magnetization quickly rotates to the stable orientation.

When the probe, coils, and the film's easy axis are aligned properly, the magnetization will smoothly rotate from the easy axis, at zero field, to parallel to the coil's axis, when the magentic field of the coils is greater than $H_k$. Therefore the magnetoresistance signal will smoothly go from the maximum to the minimum.

When the easy axis is parallel to the coil's axis, then the magnetization switches suddenly when the field is Hc. The magnetization of the film switches by the magnetization of the domains rotating, thereby making the magnetization perpendicular to the axis of the probe for a brief period. The R-H curve in this case will be flat except for a spike when the external field is equal to the coercivity. In this orientation the probe could be used to measure the coercivity of the film.

With a small rotation of the film from its proper alignment, the peaks in the magnetoresistance no longer coincide. This is caused by magnetization at zero external field no longer being at an angle of +45° to the axis of the probe. An external field is needed to rotate the magnetization into that direction. The magnetization will not be parallel to the coil's axis for a finite field, so that the magnetoresistance asymptotically approaches its minimum value. A correct magnetoresistance measurement can only be made by using a large amplitude a-c field.

A constant bias magnetic field that is parallel to the axis of the probe will only have the effect of shifting the R-H curve to the left or right. When the bias field is perpendicular to the coil's axis, the total external field will not be parallel to the coil's axis. The field will approach the direction of the coil's axis as the coil's field becomes much greater than the bias field. The magnetization will therefore asymptotically approach −45° to the probe's axis and so the minimum signal from the probe is approached asymptotically. The correct measurement of the magnetoresistance can only be made by increasing the amplitude of the a-c field.

Rotating the probe, while keeping the film's orientation to the coils fixed, will also result in a qualitative change in the R-H curve. The changes result from the axis of the probe no longer being at 45° to the mangetization when the field from the coil is at its maximum. As long as the film's easy axis is perpendicular to the coils axis, the magnetization will smoothly rotate through all angles. Hence the magnetization will be at +45° and −45° to the axis of the axis of the probe at some time in the cycle of the field. At those times the probe's output will be at its maximum and minimum. Therefore the measurement of the magnetoresistance will be correct as long as minimum and maximum readings are used for the calculation of $\Delta V_{\Delta\rho}$.

What is claimed is:

1. Apparatus for measurement of magnetoresistance parameters of a film having a surface exposed to a magnetization comprising:

a support means, and a plurality of contact points engagable with the surface of the film, the plurality of contact points being supported by the support means for contact with the surface of the film and arranged in a pattern suitable for measuring the magnetoresistance parameters of the film according to the equation $$\phi = \frac{IR}{4}\,\mathrm{Ln}\,\frac{(x+d)^2+y^2}{(x-d)^2+y^2} + \frac{IR}{4}\,\mathrm{Ln}\left(1+\frac{\Delta\rho}{\rho_0}\,\frac{((x+d)\cos\theta+y\sin\theta)^2}{(x+d)^2+y^2}\right) - \frac{IR}{4}\,\mathrm{Ln}\left(1+\frac{\Delta\rho}{\rho_0}\,\frac{((x-d)\cos\theta+y\sin\theta)^2}{(x-d)^2+y^2}\right)$$

wherein:

$\phi$ is the potential between the respective contact points,

I is the isotropic current

R is the isotropic resistance, (x±d) are the abscissa coordinates of the contact points, y is the ordinate coordinate of the contact points, $\Delta\rho$ is the magnetoresistance $\rho_o$ is the resistivity perpendicular to the magnetization, and $\theta$ is the angle of the magnetization to the abscissa.

2. The apparatus of claim 1 further comprising an alternating magnetic field source for generating an alternating magnetic field, the alternating magnetic field being interceptable with the film during movement of the anisotropic magnetoresistance parameters of the film.

* * * * *